US009279857B2

(12) United States Patent
Lin et al.

(10) Patent No.: US 9,279,857 B2
(45) Date of Patent: Mar. 8, 2016

(54) AUTOMATED TEST SYSTEM WITH EDGE STEERING (71) Applicant: Teradyne, Inc., North Reading, MA (US)

(72) Inventors: Howard Lin, Boston, MA (US); Corbin L. Champion, Tigard, OR (US); Jan Paul Anthonie van der Wagt, Carlsbad, CA (US); Ronald A. Sartschev, Andover, MA (US)

(73) Assignee: Teradyne, Inc., North Reading, MA (US)

( * ) Notice: Subject to any disclaimer, the term of this patent is extended or adjusted under 35 U.S.C. 154(b) by 277 days.

(21) Appl. No.: 14/083,985

(22) Filed: Nov. 19, 2013

(65) Prior Publication Data

US 2015/0137838 A1 May 21, 2015

(51) Int. Cl.
*G01R 31/26* (2014.01)
*G01R 31/319* (2006.01)

(52) U.S. Cl.
CPC ................... *G01R 31/31922* (2013.01)

(58) Field of Classification Search
CPC .................... G01R 31/2607; G01R 31/2601
USPC ....................................... 324/750.01
See application file for complete search history.

(56) References Cited

U.S. PATENT DOCUMENTS

| 4,734,637 A | 3/1988 | Chen et al. |
| 5,274,796 A | 12/1993 | Conner |
| 5,477,139 A | 12/1995 | West et al. |
| 5,854,797 A | 12/1998 | Schwartz et al. |
| RE36,063 E | 1/1999 | Conner |
| 6,073,259 A | 6/2000 | Sartschev et al. |
| 6,469,493 B1 | 10/2002 | Muething, Jr. |
| 6,553,529 B1 | 4/2003 | Reichert |
| 6,609,077 B1 | 8/2003 | Brown et al. |
| 7,017,091 B2 | 3/2006 | West |
| 7,480,581 B2 | 1/2009 | Lew et al. |
| 7,573,957 B2 | 8/2009 | Sartschev et al. |
| 7,574,632 B2 | 8/2009 | Sartschev et al. |
| 7,804,349 B2 | 9/2010 | Jones et al. |
| 7,856,578 B2 | 12/2010 | Sartschev et al. |
| 2002/0108079 A1 | 8/2002 | Takahashi |
| 2003/0028832 A1* | 2/2003 | Schaber ............ G01R 31/31709 714/700 |

(Continued)

FOREIGN PATENT DOCUMENTS

| WO | WO 02/075343 A1 | 9/2002 |
| WO | WO 2007/038233 A2 | 4/2007 |

OTHER PUBLICATIONS

International Search Report and Written Opinion from the International Searching Authority for International Application No. PCT/US/2014/066295 dated Feb. 16, 2015.

*Primary Examiner* — Arleen M Vazquez
*Assistant Examiner* — Robert P Alejnikov, Jr.

(57) ABSTRACT

A semiconductor device-under-test (DUT) may be tested by an automated test system that processes test programs specifying a number of edges per tester cycle that may be greater than the number of edges the tester is capable of generating. The test system may include circuitry that reduces the number of edges in each cycle of a test program based on data specifying operation of the tester in that cycle and/or a prior cycle. Such a reduction simplifies the circuitry required to implement an edge generator by reducing the total number of timing verniers per channel. Nonetheless, flexibility in programming the test system is retained.

4 Claims, 4 Drawing Sheets

(56) References Cited

U.S. PATENT DOCUMENTS

| | | | |
|---|---|---|---|
| 2003/0126530 A1* | 7/2003 | Larson | G01R 31/318328 714/724 |
| 2007/0071080 A1 | 3/2007 | Sartschev et al. | |
| 2007/0091991 A1 | 4/2007 | Sartschev et al. | |
| 2007/0124638 A1* | 5/2007 | Yamada | G01R 31/31928 714/742 |
| 2008/0238516 A1 | 10/2008 | Iorga | |
| 2009/0167401 A1 | 7/2009 | Jones et al. | |
| 2013/0106399 A1 | 5/2013 | Gohel et al. | |

* cited by examiner

AUTOMATED TEST SYSTEM WITH EDGE STEERING

DISCUSSION OF RELATED ART

Semiconductors may be tested by automated test equipment (ATE), which automates the process of generating signals for testing a device-under-test (DUT). Using ATE, sometimes called a "tester," it is possible to effectively test chips at a high throughput.

For many types of tests, operations of a tester are controlled by event signals in each of a number of channels, each of which is connected to a test point, sometimes called a "pin", on the DUT. The event signals are generated by a timing generator associated with the channel, and are sent to pin electronics. Pin electronics include a driver and a comparator. When applied to a driver, the event signals are sometimes called "edges." Some edges, when fired, cause the driver to drive a HI output. Other edges, when fired, cause the driver to drive a LO output. By specifying which of these edges fires, and the time at which they fire, within a tester cycle, a digital stimulus signal may be defined. Similarly, event signals coupled to the comparator, which are sometimes called "strobes," control the comparator to test for a HI signal or a LO signal, allowing the output of the DUT to be compared to an expected value. The results of these comparisons are used in testing the DUT, such as to determine whether it is properly operating or to control subsequent steps in the test.

To allow a tester to test many different types of semiconductor devices, testers may be programmable. A test pattern may specify various parameters, such as the signal to apply to each test point on the DUT, the signal expected to be read from the DUT, and the time of the event signals that control the generation or measurement of test signals. When testing a DUT, precision is needed in producing the stimulus signals and controlling the measurement times.

This precision is achieved through precise timing of event signals. A tester cycle may last for multiple cycles of a test system clock. Accordingly, timing of event signals within a tester cycle may be determined by counting pulses of the test system clock. However, the test system clock may not provide a desired timing resolution. Higher resolution may be achieved with an edge generator that controls timing of event signals through the use of a timing vernier, in addition to a counter that counts periods of the test system clock.

A vernier may delay an event in a signal by a fraction of a period of the tester clock. Thus, each event signal may be generated in part by a counter that counts a programmed number of cycles of a test system clock after the start of a tester cycle and then produces a signal indicating an event. This signal may be provided as an input to a vernier, programmed to introduce a further delay. The combination of delay introduced by the counter and the vernier provides a precisely timed event, with a precision greater than a cycle of a test system clock.

BRIEF DESCRIPTION OF THE FIGURES

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

The inventors have recognized and appreciated techniques to reduce the cost and complexity of automated test equipment without decreasing functionality. In some aspects, the number of timing verniers in an automated test system may be reduced without reducing user flexibility in programming drive signals output by the test system. Such a reduction may be achieved by circuitry that dynamically steers time specifications for edges to verniers that output an indication of when the edges are to occur. Based on the time specifications, the steering circuitry may reduce the total number of edges that are required to control a driver to generate a desired output for one cycle of tester operation. By reducing the number of required edges, the number of verniers in each tester channel may be reduced and tester hardware may be designed with fewer verniers. Such tester hardware may be smaller, lower cost, consume less power, and/or dissipate less heat than conventional tester designs offering the same functionality.

Accordingly, systems and methods are disclosed for providing steering of time specifications produced by a timing generator. This capability is referred to herein as "smart edge steering." The smart edge steering may be performed by a method that may include one or more of: receiving inputs that specify time specifications for edges; determining a fire ordering for the edges based on the received time specification inputs; sequencing the time specifications according to the fire ordering; serializing the time specifications; and outputting the serialized time specifications. The serialized time specifications may specify a reduced number of required edges. These time specifications may be combined with drive data at pin electronics to produce one or more edges, which are applied to a driver to cause a test signal to be sent to the DUT at the specified time.

Alternatively or additionally, edge steering within a tester may steer multiple edge specifications to the same vernier to cause it to output multiple edges in the same tester cycle. Such steering may also reduce the number of verniers needed in a channel to control a driver to generate a desired signal. To achieve a reduction in this way, the edge steering circuit may, for each tester cycle, distinguish between timing specifications specifying edges in a first portion of the tester cycle and timing specifications specifying edges in a second portion of the tester cycle. The first portion of the timing specifications may be applied to the verniers first. Subsequently, for the same tester cycle, the second portion may be applied to the same verniers.

As described above, an automated test system may be used to test semiconductor chips in an automated and/or semi-automated manner. Using a tester, it is possible to effectively test chips at a high throughput. A tester operates by generating stimulus signals and measuring responses on each of a number of test points on the DUT. The input/output points of the tester are designed to be coupled to test points on the DUT, are sometimes referred to as "pins." This terminology is used generically to refer to a connection point of a DUT, and does not limit the manner in which that connection is made, as connections may be made to a DUT in any suitable way, before or after the DUT is packaged.

Multiple types of stimulus and response signals may be generated and/or measured in order to test a modern semiconductor device. To accommodate this variability, a tester may incorporate a number of instruments, each of which may generate and/or measure test signals of a certain type at one or more pins.

Each instrument has circuitry to process a signal for one or more pins. A tester includes some circuitry that performs operations that impact the test signals generated for all, or combinations of, pins. However, to fully test a DUT, it is frequently necessary that the tester contain circuitry that can independently generate and/or measure a test signal for each of multiple pins in every cycle of DUT operation. The circuitry that is dedicated to processing a test signal for one pin is called a "channel." An instrument may contain one or multiple channels.

One common type of instrument is a digital instrument, designed to generate or measure a digital signal. A digital instrument may contain numerous channels, with each having circuitry, called "pin electronics," that generates a digital signal or determines the state of a digital signal. To perform these operations, the pin electronics may include a driver and a comparator. Each of these may be controlled in various ways to support flexibility in configuring a tester to test multiple types of semiconductor devices. For example, the driver may be configurable to set the voltage that will be driven when the driver is driving a logical HI signal and driving a logical LO signal. The comparator may similarly be configured for the voltage levels that will be recognized as a logical HI or logical LO signal. Accordingly, the voltage levels that correspondence to HI and LO are not critical to the invention.

A test program, loaded into the tester, may specify for each channel, an operation for each cycle of DUT operation. The tester may be programmed to operate with tester cycles that match the cycles of DUT operation. Specified operations within each tester cycle may include, for example, drive HI or drive LO. To measure a test signal, the specified operation may include checking for a HI or checking for a LO. In some tester cycles, no operation may be performed for a particular channel, and this possibility may also be reflected in the program.

In addition to specifying what operation is to be performed, the timing of each operation, or actions in completing that operation, may be programmed. This programming is achieved by a programmable timing generator within the channel. The timing generator outputs timing specifications for event signals that control an operation within the pin electronics, with different event signals controlling different operations.

In a conventional test system architecture, all of the timing specifications for event signals are coupled to an edge generator. The edge generator conventionally comprises circuitry that generates edge signals at the specified times corresponding to all of the timing specifications. The shape of the event signals may depend on the construction of circuitry in the test system. However, each event signal will have, at a defined time, a signal transition or other feature of the type to which an element of the pin electronics responds. The time of this signal transition may be said to be the time of the event.

In the case of a DUT cycle in which a channel is to perform a compare operation, the event signal may control when, relative to the start of that cycle, the value at a pin should be compared to an expected value. Such an event signal is sometimes called a "strobe." In the case of a cycle in which a channel is to perform a drive operation, multiple event signals may be generated to specify the desired output. These event signals may be called "edges." Pin electronics may include edge coupled logic such that the signal transition may be a LO to HI transition or a HI to LO transition. However, it should be appreciated that an "edge" may be represented by a signal of any suitable form.

Regardless of the form of the signal transition, one or more edges may be combined in the pin electronics to generate a suitable stimulus signal, which may depend on the formatting required for a specific protocol used by the DUT. For example, in accordance with some digital protocols, a "1" may be represented by a transition to a logical HI state at a first time, followed by a transition to a logical LO at a second time. In this case, two edge signals are required to define the desired output. In other protocols, a "1" may be represented by a transition to a logical LO state followed by a transition to a logical HI state, followed by a transition to a logical LO at a second time. In this case, three edge signals are required to define the desired output.

To provide such event signals, and flexibility in programming a test system to test DUTs of many types, each channel of the test system may include edge generator circuitry to generate multiple event signals. The edges and strobes output by the edge generator are coupled to control inputs of the pin electronics, with different events controlling different operations, such as drive HI, compare to an expected HI value, etc.

The timing of these events, within each tester cycle, may be established by timing specifications from a timing generator. The timing generator may compute the timing specifications for each event. This computation may be based on a "time set" stored in a time set memory as part of a test program in combination with data defining what operation, during each cycle, the channel is to perform. Each time set may specify a time for each event that could be generated in a tester cycle. The memory may contain multiple time sets and, from cycle to cycle, a different time set may be specified in the test program to allow flexibility in controlling the timing of events within the pin electronics.

In some cycles, depending on programmed operations and on the format of signals to be generated or measured, not every event will be needed for a programmed operation. Accordingly, each timing specification may be associated with an enable signal to indicate whether, for a particular cycle, the action associated with that edge signal is to occur in order to complete a programmed operation. This enable signal may be generated based on the data indicating the operation for the channel in a particular tester cycle and the format in which digital values are represented. For example, in a cycle in which drive data is to be provided, strobe signals may not be enabled. As another example, when the programmed operation is completed by the output signal being in a HI state at a specific time, only one edge signal may be required to trigger the driver to drive HI at the specified time. Other edge signals may be disabled. In contrast, if the signal format requires a transition from LO to HI followed by a transition for HI to LO, multiple edge signals may be enabled to ensure that the driver is triggered to be in a LO state at the beginning of the cycle, there is a transition to a HI state and then a subsequent transition to a LO state.

To support a large number of possible stimulus signals, an edge generator may generate multiple edge signals per cycle. As a specific example, a conventional test system may generate four edge signals that any of which, when fired, will cause a driver to drive HI. An additional four edges, when fired, may cause a driver to drive LO. Thus, a stimulus signal with a total of eight signal transitions per tester cycle may be programmed. However, not every stimulus signal will require all of the edges to be fired.

Thus, during each cycle, only some of the edges may be used. Which edges are generated may be determined by the timing generator, using techniques as are known in the art, based on the specific operation programmed for that cycle and the data specified for that operation. However, because the specific edges used vary from cycle to cycle, conventionally, the edge generator has included circuitry that can generate every edge signal in every cycle. This circuitry may include a counter and a vernier for each edge that could be generated. The counter counts from the start of the tester cycle some number of cycles of a test system clock, to reach a time that is close to, but before, the specified time. At this time, the counter outputs a signal transition, which is then delayed in a vernier. The vernier may be an analog circuit that can impart a precise amount of programmable delay that is a fraction of one period of the test system clock. In this way, the combined delay through the counter and the vernier results in a signal with a transition that occurs at the specified time of the edge.

The inventors have recognized and appreciated that cost and complexity of a test system could be reduced, while retaining user functionality, by avoiding the need for a separate vernier for every possible edge signal that might be programmed in a cycle. Timing verniers are complex to integrate into a circuit, and consume power and silicon die area. The inventors have recognized and appreciated that it is possible to reduce the use of timing verniers by using an approach, called smart edge steering, to reduce the number of edges generated by an edge generator, as described below. This reduction may be achieved without reducing the ability of a user to program a number of edges.

In accordance with smart edge steering, timing specifications for edges in each cycle may be processed to produce for that cycle a reduced number of specifications for edges. The reduction may be based on specific signal formatting and specific data programmed for the cycle and may result in edges that, when applied to the pin electronics, generate the same test signal that would have resulted had the number of edges not been reduced.

In some embodiments, a timing generator may output a set of time specifications for m edges. The number m may, in some embodiments, correspond to a number of edges that a programming language supports. Test engineers and other users of the test system may write programs with the expectation that m edges may be programmed and the test system can generate m edges.

The set of time specifications may be received by an edge steering circuit, which processes the time specifications to potentially coalesce, cancel, or otherwise reduce the number of time specifications for edges. The edge steering circuit may then send each of the remaining time specifications to one of n timing verniers, which may be part of the edge generator. The number of timing verniers n may correspond to the number of edges for which time specifications are provided by the edge steering circuit, which may be different from the number of edges m for which timing specifications were supplied by the timing generator. In some cases, the number of timing verniers n may be less than the number of edges m specified by the timing generator. In some embodiments, the number of timing verniers n may be half the number of edges m specified by the timing generator. Thus, despite the perception of the user that the test system can generate m edges, the test system may contain verniers to generate fewer than m edges per tester cycle.

The use of fewer timing verniers than the number of edges specified can be enabled by a number of methods. In some embodiments, each vernier may be capable of firing more than once per tester cycle. As a result, timing specifications indicating events during a first portion of a tester cycle may be steered to as many as all of the verniers. Timing specifications indicating events during a second portion of a tester cycle again may be steered to as many as all of the verniers, allowing at least twice as many events in one tester cycle as there are verniers. Alternatively or additionally, in some embodiments, redundant edge specifications may be removed by the smart edge steering circuitry, leaving, in each cycle, a smaller number of edge specifications that can be implemented in a tester with a reduced number of verniers.

Figure 1:
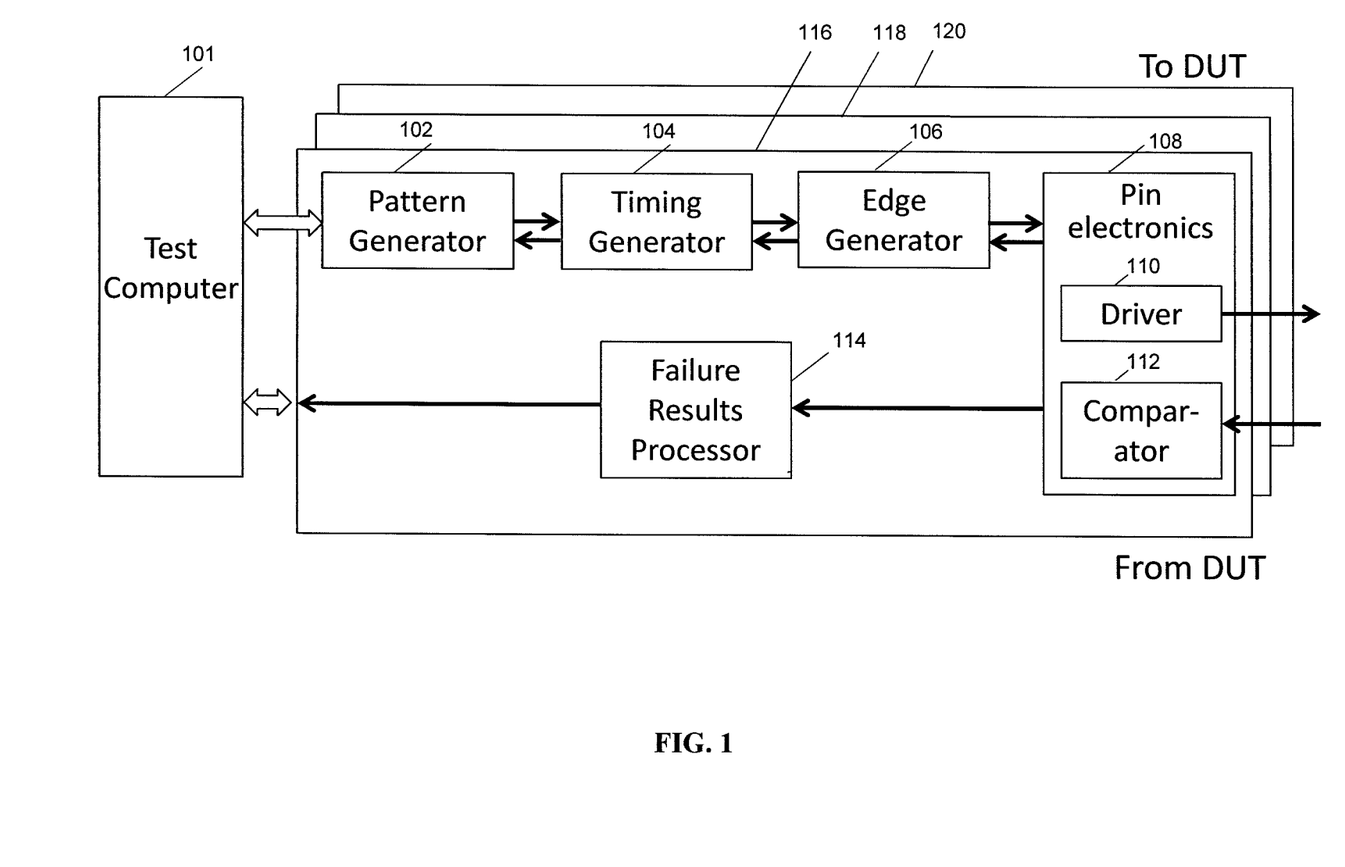
FIG. 1 is a schematic drawing of a tester, in accordance with some embodiments.

FIG. 1 is a schematic drawing of a tester in accordance with some embodiments. In the illustrated embodiment, the tester is shown with a plurality of digital channels, of which channels 116, 118 and 120 are numbered. Each of the channels may be configured to generate or measure a digital test signal that is applied to a test point on DUT. It should be appreciated that FIG. 1 represents a simplified block diagram of a tester. A commercial tester may include more digital channels and may include other instruments, which are not shown for simplicity of illustration.

Each of the channels 116, 118 and 120 may include pattern generator 102, timing generator 104, edge generator 106, pin electronics 108 (which includes driver 110 and comparator 112), and failure results processor 114. Pin electronics 108 may be coupled to a test point of a DUT (not shown).

Test computer 101 may coordinate all channels in the tester, including channels 116, 118, and 120. Test computer 101 may be programmed to load test programs into pattern generators in each of the channels and otherwise configure programmable circuitry within the tester. Test computer 101 also may initiate operation of those pattern generators and retrieve data captured during execution of a test.

In some embodiments, test computer 101 may provide non-interactive control of the tester, such as in a production environment. In other embodiments, test computer 101 may provide interactive control of the tester, such as in a development environment. A test program may be loaded into test computer 101, which may then load a channel-specific subset of the test program into pattern generator 102, as well as pattern generators for each other channel (such as channels 118, 120). Other data that specifies execution of the test may also be loaded. This data may include programmed times for edges in each of multiple, values to drive and data that defines the format of by which drive data is represented. The operation of the channels may be synchronized by signals from test computer 101, control circuitry within the tester, control signals exchanged between channels or any other suitable technique, including control techniques as are known in the art.

Further detail is illustrated for channel 116, which may be illustrative of other digital channels in the tester. Within channel 116, pattern generator 102 provides, for each tester cycle, a value indicating an operation to be performed by pin electronics 108. Timing generator 104 produces timing specifications for events that will control the pin electronics 108 to perform the desired operation. Accordingly, timing generator 104 generates timing specifications for one or more events according to the pattern specified by pattern generator 102. Both which events are enabled in a tester cycle and the time at which those events occur may be determined based on the pattern and/or other data that may be programmed into the tester, such as a format. In some embodiments, the information defining the operations may be loaded into the tester as multiple separate data sets. For example, format data may be loaded into a format memory—or even pre-programmed into the tester. Data for each tester cycle may be loaded and stored as a pin data mask, which may be applied to a time set. Timing data may be loaded and stored as one or more time sets. Accordingly, in determining timing of events, timing generator 104 may select from one of a number of time sets, stored within timing generator 104 in a time set memory (not shown) based on programming within a pattern, as in a conventional tester. The timing generator may then determine, based on an operation specified for the cycle, as well as the data and format associated with that operation, which of those events are enabled in that cycle. However, any suitable approach may be used to specify timing of events that control the pin electronics to perform programmed operations.

The timing specifications are sent to edge generator 106, together with information about the type of edge signal desired. Edge generator 106 may generate one or more event signals with the specified timing. The event signals may then be output to pin electronics 108 where the event signals act as high-resolution timing signals that control operation of the pin electronics. The event signals may be coupled to specific control inputs of the pin electronics so that each edge signal, when it fires, causes a specific effect on the drive signal generated for the pin, such as drive HI or drive LO at times determined by those edge signals. Strobe signals generated by edge generator 106 likewise may control measurements made by comparator 112.

Pin electronics 108 may respond to the generated edge or edges to drive a test signal on a pin via driver 110, in some embodiments. Likewise, the pin electronics may respond to the strobe or strobes to measure a signal output from the DUT. The results of the comparison may be passed to failure results processor 114. Failure results processor 114 may then take any one or more actions, including recoding the results of the comparison, selectively recording the result when the result is not as expected or generating control signals indicating when a failure has occurred such as by setting a hardware signaling line called a "failure flag." Pattern generator 102, or any other suitable components within the tester, may respond to the failure flag to perform different operations in response to a failure.

Figure 2:
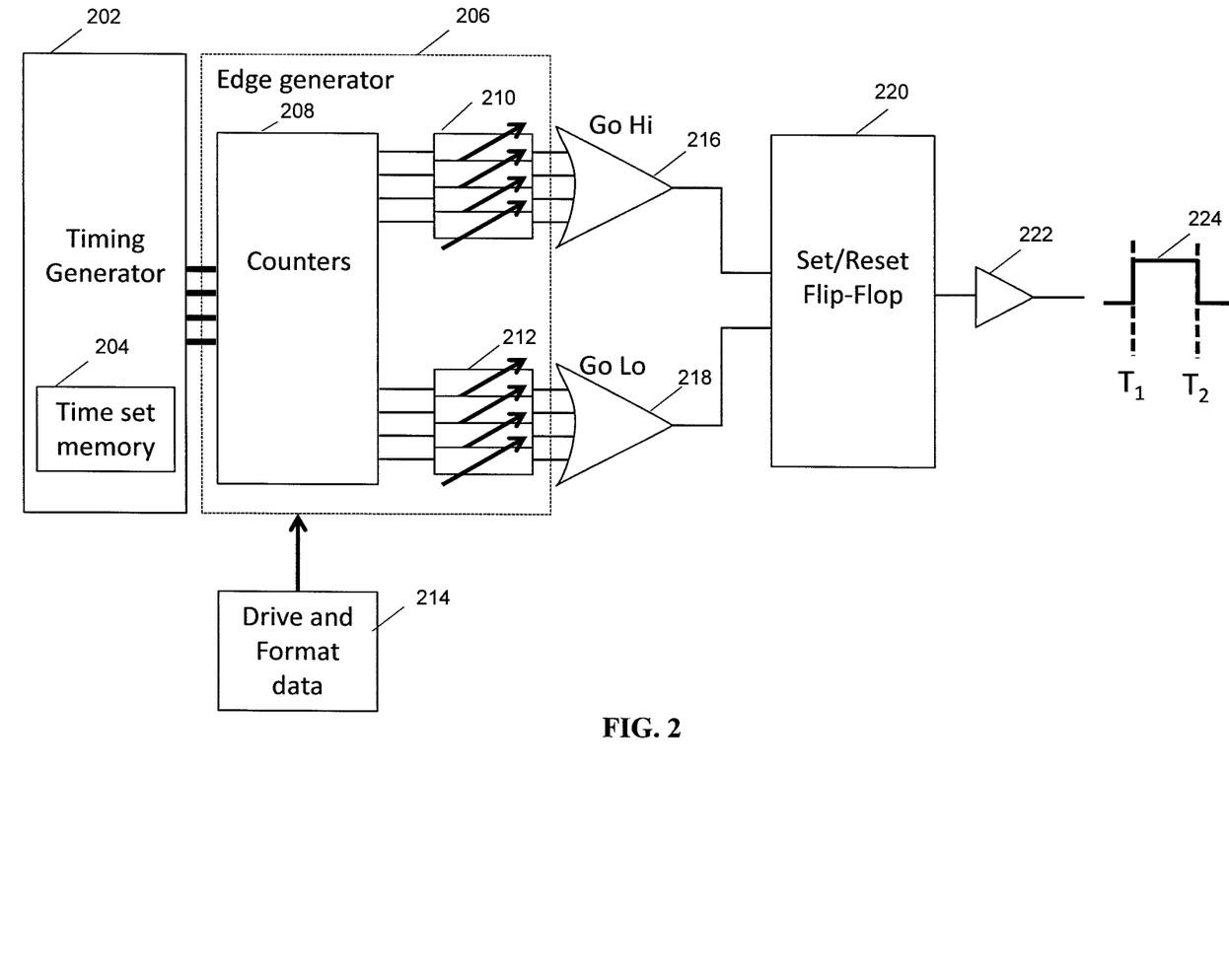
FIG. 2 is a block diagram of a conventional channel circuitry of a tester.

In some testers, the number of edge signals capable of being generated is based on the number of verniers provided in the edge generator. In embodiments as described herein, however, channel 116 may include smart edge steering circuitry that allows fewer verniers in edge generator 106 than a conventional edge generator implementing the same level of functionality. FIG. 2 is a block diagram of a portion of conventional channel circuitry of a tester, showing in greater detail portions of a single channel for sending a signal to a single DUT pin. Accordingly, FIG. 2 illustrates the generation of edge signals, but, in some embodiments, techniques as described herein may be applied to strobes or other control signals.

As described above, timing generator 202 generates time specifications for one or more edges using values stored in time set memory 204. Edge generator 206 receives the time specifications from timing generator 202. Other signals may indicate whether an edge is to be generated at a specified time during a tester cycle. These signals may act as enable signals, and may be represented in any suitable way, such as drive data, indicating a value to be driven in a channel in a tester cycle. The enable signals may be derived from multiple data sets, such as the drive and format data set 214, illustrated in FIG. 2. These enable signals may be applied within edge generator 206 in any suitable way. In some embodiments, enable signals may suppress processing of time specifications at the input of edge generator 206 for edges that are not enabled. Alternatively, in some embodiments, enable signals may suppress the output of edges or other processing within edge generator 206.

Regardless of the manner in which an edge may be suppressed, for edges not suppressed, circuitry within edge generator 206 may generate a timing control signal with at signal transition at an appropriate time. To perform this function, edge generator 206 may include counters 208, and groups of timing verniers 210 and 212. Edge generator 206 divides each timing specification into a coarse part and a fine part. In this example, coarse and fine are defined relative to a period of the clock used to control operation of edge generator 206. The coarse part can be counted as a number of cycles of that clock. The fine part specifies a time shorter than the period of that clock.

Upon receiving time specifications, circuitry within edge generator 206 loads the coarse part into a counter within counters 208, and the fine part is loaded into a timing vernier of the groups of timing verniers 210 or 212. Counters 208 and verniers 210 and 212 may be implemented in any suitable way, including using techniques as are known in the art. Counters 208, for example, may be implemented as a collection of counters, with a separate counter for each edge. Alternatively, the same result may be achieved by a ring counter or other suitable structure that can output an indication when any of multiple programmed times is reached.

Groups of timing verniers 210 and 212 may each comprise four verniers, as a non-limiting example. In this example, the verniers within each group have the same function. Edges output by any of the verniers within group 210, in this example, define a time when driver 222 transitions to driving a HI output. Verniers within group 212, in this example, define a time when driver 222 transitions to driving a LO output. In the example circuitry in FIG. 2, this result is achieved by combining, in an OR operation, the outputs of the verniers in group 210 within OR circuitry 216. Likewise, the outputs of the verniers in group 212 are combined within OR circuitry 218.

The outputs of OR circuitry 216 and OR circuitry 218 are applied to driver 222 through a set/reset flip flop 220. As shown in FIG. 2, the output of OR circuitry 216 is coupled to the set input of set/reset flip flop 220. The output of OR circuitry 218 is coupled to the reset input of set/reset flip flop 220.

Accordingly, the output of set/reset flip flop 220 will be HI in response to any one of the verniers within group 210 generating an edge signal. Following such an edge signal, the output of set/reset flip flop 220 will stay HI until one of the verniers within group 212 generates an edge signal. The output of set/reset flip flop 220 serves as an input to driver 222 such that the output 224 of driver 222 is defined by the order and timing of the firing of edges within groups of verniers 210 and 212. As a specific example, output 224 has a rising edge at time $T_1$, indicating the firing of an edge from a vernier within group 210 at time $T_1$. Output 224 has a falling edge at time $T_2$, indicating the firing of an edge from a vernier within group 212 at time $T_2$.

In the example illustrated, only two edges are used to generate outputs 224. However, it should be appreciated that more complex waveforms may be used in testing semiconductor devices. For this reason, the edge generator illustrated in FIG. 2 has a total of eight verniers, allowing a complex waveform with up to eight signal transitions in each tester cycle to be specified.

The ability to specify multiple edges within the tester cycle facilitates programming of a test system. The inventors have recognized and appreciated, however, that in any tester cycle, not all edges may be used. Rather, a test program may be written to use different combinations of edges in different tester cycles to specify different waveforms to be output by a driver. While such flexibility is useful for a programmer, implementing a tester that supports this flexibility using conventional designs leads to having more verniers than are necessary in any given cycle. To allow output signals, specified collectively by the programming of m edges, to be generated with n verniers, a smart edge steering circuit may be used. The smart edge steering circuit may, from tester cycle to tester cycle, direct each timing specification to a vernier. In this way, there need not be a one-to-one relationship between programmed edges and timing verniers. The total number of verniers, n, may therefore be less than m. In some embodiments, the ratio of n and m may be 2n<m, or n and m may have any other suitable ratio.

Figure 3:
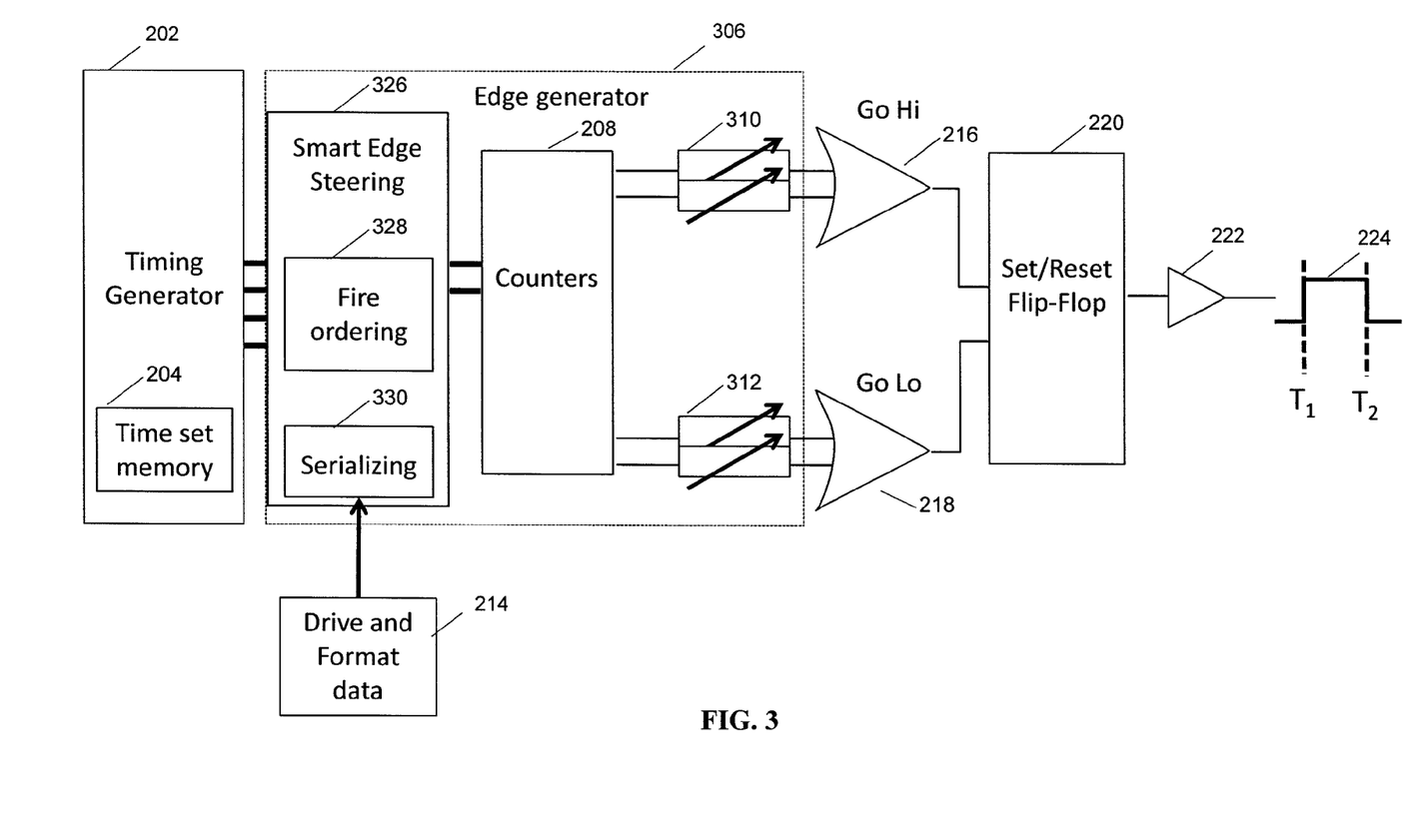
FIG. 3 is a block diagram of channel circuitry of a tester, in accordance with some embodiments.

FIG. 3 is a block diagram of the portion of channel circuitry of a tester illustrated in FIG. 2, modified to include smart edge steering circuit 326, in accordance with some embodiments. In the embodiment illustrated, timing generator 202, outputs timing specifications for edges to smart edge steering (SES) circuit 326. SES circuit 326 may, using one or more techniques as described herein, reduce the number of timing specifications for which an edge is generated. This reduction may occur dynamically on a tester cycle-by-tester cycle basis. As a result, in comparison to edge generator 206, edge generator 306 may have less circuitry for generating edges. Specifically, in this example, edge generator 306 includes vernier groups 310 and 312, each of which contains only two timing verniers. In contrast, vernier groups 210 and 212 each includes four verniers, such that the number of verniers in edge generator 206 is twice that in edge generator 306. Likewise, counters 308 may include circuitry for processing fewer time specifications than counters 208.

The outputs of each of the vernier groups 310 and 312 may have the same effect on the operation of driver 222 as the outputs of vernier groups 210 and 212. As shown in the example of FIG. 3, the outputs of the verniers within vernier group 310 are provided as inputs to OR circuitry 316. As with OR circuitry 216, OR circuitry 316 combines the outputs of multiple verniers to produce control signals to control the set input to set/reset flip-flop 220. Likewise, OR circuitry 318 combines the outputs of multiple verniers to control the reset input to set/reset flip-flop 220. Thus, even with a reduced number of events generated, the net result may be the same, as indicated by the circuitry of FIG. 3 producing the same output 224 as the circuit in FIG. 2.

To reduce the number of edges generated in a tester cycle, without impacting functionality, SES circuit 326 may include fire ordering circuit 328 and serializing circuit 330.

In some embodiments, the operation of SES circuit 326 may proceed as follows. First, fire ordering circuit 328 within SES circuit 326 may order all of the edges programmed to fire within a tester cycle. In some embodiments, a test engineer may define, as part of a test program, times within a tester cycle when edges are to be fired. However, the programming model may not require the edges to be programmed in any specific order, such that in some tester cycles or some test programs, one programmed edge may have a time that is before another programmed edge, but in other programs or other tester cycles, the reverse may occur for the same two edges. In fire ordering circuit 328, the order of all the edges is determined based on the timing specifications for the edges in that tester cycle.

For example, the order may be determined to be "HI HI LO LO LO HI HI HI," where each HI indicates that an edge that causes driver to drive HI has been programmed to fire and LO indicates that an edge that causes driver to drive LO has been programmed to fire. In this example, eight edges are shown in the fire order sequence. The number eight is chosen for illustration to correspond with the eight verniers illustrated in FIG. 2, representing the number of edges for which a test engineer may have written programs. It should be appreciated that test programs may be written with any suitable number of edges, which may be more or less than eight. Moreover, as described above, not all edges may fire in every tester cycle. In some embodiments, fire order circuit 328 may process only time specifications for edges enabled during the tester cycle. Accordingly, the number of timing specifications for which an ordering is produced in fire order circuit 328 may be different than in the above example and that number may vary from tester cycle-to-tester cycle, depending on the number of edges enabled in each tester cycle.

Fire order circuit 328 may be implemented in any suitable way. In some embodiments, for example, comparators, multiplexers and/or other known digital logic components may be combined to order digital values representing timing specifications. The ordered values may be stored in a FIFO memory or represented in any other suitable way.

Regardless of the manner in which the timing specifications are ordered, once ordered, edge specifications may be removed from the order by SES circuit 326. Any suitable criteria may be used to remove edge specifications from the order. In some embodiments, timing specifications may be removed when generation of an edge at the specified time would not impact the output of driver 222. As a specific example, edge time specifications may be removed if they are redundant. An order in which timing specifications are associated with sequential edges of the same type may contain redundant information, because applying a second drive HI edges to set/reset flip flop 220 immediately following a first drive HI edge does not change the state of set/reset flip flop 220. Accordingly, SES 326 may reduce the set of timing specifications to include a set that fires in ordered HI-LO pairs.

In some embodiments, suppression of edge specifications may be performed on only the specifications for edges to be fired within a single tester cycle. However, the first edge specified for a tester cycle may be redundant if it does not cause a change in the state of driver 222 from the last edge specified for the preceding cycle. Accordingly, in some embodiments, SES circuit 326 may perform fire suppression from the end of the previous cycle to the beginning of a current cycle.

As an example, Table 1 is shown below. In the example, 4 HI and 4 LO edges are supported in a programming model. Accordingly, the center column of Table 1 shows exemplary sequences containing up to 4 HI edge times and up to 4 LO edge times. These edge sequences may be generated in a single tester cycle. The right column shows how these sequences might be reduced to sequences using a reduced number of HI and LO transitions. In some embodiments, the reduced edge sequence in any tester cycle may depend on the state of the driver at the end of the prior tester cycle. Further reduction in the number of edges may be achieved when redundant edges are identified both based on adjacent edges in the same tester cycle as well as adjacent edges from a prior tester cycle. Accordingly, Table 1 includes a left-most column indicating the last edge in a sequence of the prior tester cycle. As can be seen, when the first edge in a sequence in a tester cycle is redundant based on the last edge in a sequence from the prior cycle, further reductions in the number of transitions in the sequence may be achieved.

TABLE 1

| Last Edge Output in Prior Tester Cycle | Timing Generator Output/SES Input for Tester Cycle | SES Output for Tester Cycle |
| --- | --- | --- |
| LO | HI HI HI HI | HI |
| HI | HI HI HI HI | — |
| LO | HI HI HI LO | HI LO |
| HI | HI HI HI LO | LO |
| LO | HI HI LO LO | HI LO |
| HI | HI HI LO LO | LO |
| LO | HI HI LO HI | HI LO HI |
| HI | HI HI LO HI | LO HI |
| LO | HI LO LO HI | HI LO HI |
| HI | HI LO LO HI | LO HI |
| LO | HI LO HI HI | HI LO HI |
| HI | HI LO HI HI | LO HI |
| LO | HI LO HI LO | HI LO HI LO |
| HI | HI LO HI LO | LO HI LO |
| LO | HI LO LO LO | HI LO |
| HI | HI LO LO LO | LO |
| LO | LO HI HI HI | HI |
| HI | LO HI HI HI | LO HI |
| LO | LO HI HI LO | HI LO |
| HI | LO HI HI LO | LO HI LO |
| LO | LO HI LO LO | HI LO |
| HI | LO HI LO LO | LO HI LO |
| LO | LO HI LO HI | HI LO HI |
| HI | LO HI LO HI | LO HI LO HI |
| LO | LO LO LO HI | HI |
| HI | LO LO LO HI | LO HI |
| LO | LO LO HI HI | HI |
| HI | LO LO HI HI | LO HI |
| LO | LO LO HI LO | HI LO |
| HI | LO LO HI LO | LO HI LO |
| LO | LO LO LO LO | — |
| HI | LO LO LO LO | LO |

Though examples are given above in which edges are suppressed based on being redundant, other criteria may be used to eliminate edges, including, for example, that an edge at a programmed time may be ineffective. An ineffective edge may come about, for example, in some embodiments, because certain circuits, such as verniers 310 and 312, or set-reset flip-flop 320, may have a settling time that limits how fast the circuitry can respond to a sequence of three or more edges. For example, a sequence of LO, HI, LO is only effective if the circuitry generating a signal in accordance with this sequence has time to respond to the HI edge before the edge commanding a return to a LO state occurs. If not, the HI, and the following LO edge may be omitted without impacting the output. Accordingly, other criteria may be applied by SES circuit 326 to suppress one or more edges.

Regardless of the manner in which timing specifications are suppressed, the reduced set of timing specifications may be passed on to counters 308 and groups of verniers 310 and 312 to generate edge signals, using techniques as described above for counters 208 and groups 210 and 212. This action, or passing on selected ones of the ordered timing specifications for edge generation, may be performed by serializing circuit 330 or any other suitable circuitry. Serializing may be implemented with known digital logic components or in any other suitable way.

In some embodiments, the number of verniers needed in a tester cycle, and thus the number of verniers included in a tester channel, may be further reduced by using the same vernier to generate more than one edge per cycle. Once the time specifications are ordered, it is possible to assign the time specifications to verniers to provide the maximum possible separation between edge firing times for any vernier—or to at least ensure that the specified firing times are separated by at least the refire time of the vernier. Such an ordering may be achieved, for example, by assigning specifications to verniers within each group 310 and 312 in a round-robin order. If there are more time specifications for an edge type (e.g. drive HI or drive LO) in a tester cycle than there are verniers in the group for that type, round-robin assignment may result in one or more verniers within the group being controlled to fire more than once within the tester cycle. The round-robin assignment based on the ordering ensures that any time a vernier fires for a second, or subsequent time, within a tester cycle, that vernier fired the longest ago of any of the other verniers within its group.

When multiple firings of a vernier within a tester cycle are possible, the circuitry that assigns the timing specifications to verniers may operate at a higher clock rate than other circuitry within the tester. In some embodiments, serializing circuit 330 may operate at a higher clock frequency, such as an 800 MHz frequency, when the system clock for other components in the tester is 400 MHz. Such a higher clock frequency may facilitate processing multiple edge time specifications per tester cycle.

Regardless of the clock frequency of serializing circuit 330, serializing circuit 330 may provide edge time specifications to a counter or counters within counters 308 and verniers within groups 310 and 312.

Figure 4:
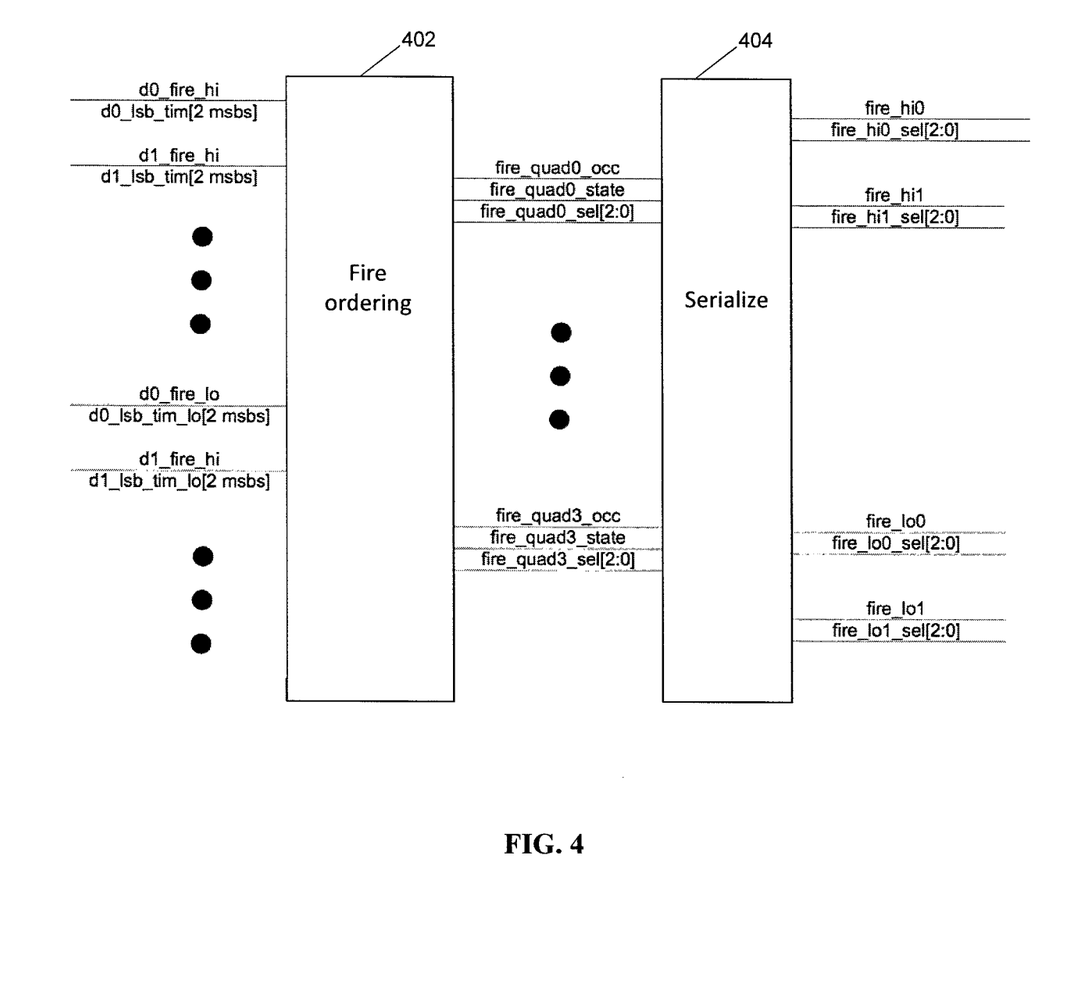
FIG. 4 is a block diagram of edge steering circuitry, in accordance with some embodiments.

FIG. 4 is a block diagram of edge steering circuitry, in accordance with some embodiments, which illustrates a reduction in the number of edge specifications. In this embodiment, smart edge steering circuitry comprises fire ordering circuit 402 and serializing circuit 404.

Fire ordering circuit 402 has inputs d(n)_fire_hi, d(n)_fire_lo, d(n)_lsb_tim[2 msbs], and d(n)_lsb_tim_lo[2 msbs], where (n) is replaced by an integer from 0 to 3, which are inputs providing timing specifications for edges from a timing generator. Four HI and four LO input lines are provided, where the HI lines allow the timing generator to specify a HI edge and the LO lines allow the timing generator to specify a LO edge, thereby allowing a timing generator to specify up to four HI and four LO edges to be fired within a given cycle.

Fire ordering circuit 402 has four sets of outputs, each set comprising three values, a fire_quad(n)_occ output, a fire_quad(n)_state output, and a fire_quad(n)_sel[2:0] output, where (n) is replaced by an integer from 0 to 3. Each set of outputs from fire ordering circuit 402 provides a time specification, a state, and a selector to serializing circuit 404. These outputs may collectively define an edge and a time, indicating both whether it is a drive HI or a drive LO edge, as well as a time at which it is to occur, and/or whether that edge is enabled for the specific tester cycle. This information may be represented in any suitable way, including by having the entire time specification appear as the output or by using a fewer number of bits to indicate a location or selector setting that may be used to access the data for an edge.

Regardless of how the information defining each edge is represented, the edges for which information is to be provided may be ordered. For example, the specification for an edge associated with fire_quad(n)_occ may come first when the parameter n has a lower value than for a timing specification for which the parameter n has a higher value.

Serializing circuit 404 has as inputs the outputs of fire ordering circuit 402. Serializing circuit 404 receives the outputs of fire ordering circuit 402 and one or more signals for generating HI or LO edges to the edge generator in accordance with the specified order. Serializing circuit 404 outputs time specifications on four sets of two outputs. The four sets of two outputs are: fire_hi0/fire_hi0_sel[2:0], fire_hi1/fire_hi1_sel[2:0], fire_lo0/fire_lo0_sel[2:0], and fire_lo0/ fire_lo0_sel[2:0]. As HI and LO are indicated by the specific output lines used by each timing signal, a state output is no longer needed. Serializing circuit 404 produces outputs fire_hi0/fire_hi0_sel[2:0] and fire_hi1/fire_hi1_sel[2:0], which are used to cause the edge generator to generate a HI edge, and which include the time specification and selector received from fire ordering circuit 402. Serializing circuit 404 also produces outputs fire_lo0/fire_lo0_sel[2:0] and fire_lo1/fire_lo1_sel[2:0], which are used to cause the edge generator to generate a LO edge, and also include the time specification and selector received from fire ordering circuit 402.

Additional Aspects

Having thus described several aspects of at least one embodiment of this invention, it is to be appreciated that various alterations, modifications, and improvements will readily occur to those skilled in the art.

For example, an exemplary circuit configuration was provided. In accordance with this configuration, processing of data specifying edges was stored in specific ways and processing was done in a specific order. However, it should be appreciated that processing functions may reordered and that different data storage formats may be used. For example, it was described that a pin mask might be applied in a fire order circuit to determine which edges are generated in a tester cycle. However, the pin mask, alone or in combination with other data, may be applied at any circuit stage, including in a serializing circuit to avoid a specification for which no edge is needed being loaded into a vernier or even to gate the output of a vernier to suppress a generated output that is not required.

Such alterations, modifications, and improvements are intended to be part of this disclosure, and are intended to be within the spirit and scope of the invention. Further, though advantages of the present invention are indicated, it should be appreciated that not every embodiment of the invention will include every described advantage. Some embodiments may not implement any features described as advantageous herein and in some instances. Accordingly, the foregoing description and drawings are by way of example only.

As used herein, the terms HI and LO refer to states of a signal. In some embodiments, these states may correspond to voltage levels, such that a HI state corresponds to a voltage that is higher than the LO state. However, it should be appreciated that HI and LO may refer to logical states that may be represented by any suitable parameter and any suitable value of that parameter. Accordingly, if the HI and LO states both correspond to voltages, in other embodiments, the voltage in the LO state may be higher than in the HI state.

In the foregoing description, circuitry is described as responding to edges in a timing signal. It should be appreciated that an edge as described herein is an example of an event, such as a zero crossing or polarity reversal, in a signal that may be used to control the timing of an operation of a circuit component. Circuitry may be constructed to respond to any suitable edge in a signal.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Alternately, a processor may be implemented using circuitry in any suitable format.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone, a tablet, or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, touch screens, and digitizing tablets. As another example, a computer may receive input information through speech recognition or in other audible format.

Such computers may be interconnected by one or more networks in any suitable form, including as a local area network or a wide area network, such as an enterprise network or the Internet. Such networks may be based on any suitable technology and may operate according to any suitable protocol and may include wireless networks, wired networks or fiber optic networks.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, the invention may be embodied as a computer readable storage medium (or multiple computer readable media) (e.g., a computer memory, one or more floppy discs, compact discs (CD), optical discs, digital video disks (DVD), magnetic tapes, flash memories, circuit configurations in Field Programmable Gate Arrays or other semiconductor devices, or other tangible computer storage medium) encoded with one or more programs that, when executed on one or more computers or other processors, perform methods that implement the various embodiments of the invention discussed above. As is apparent from the foregoing examples, a computer readable storage medium may retain information for a sufficient time to provide computer-executable instructions in a non-transitory form. Such a computer readable storage medium or media can be transportable, such that the program or programs stored thereon can be loaded onto one or more different computers or other processors to implement various aspects of the present invention as discussed above. As used herein, the term "computer-readable storage medium" encompasses only a computer-readable medium that can be considered to be a manufacture (i.e., article of manufacture) or a machine. Alternatively or additionally, the invention may be embodied as a computer readable medium other than a computer-readable storage medium, such as a propagating signal.

The terms "program" or "software" are used herein in a generic sense to refer to any type of computer code or set of computer-executable instructions that can be employed to program a computer or other processor to implement various aspects of the present invention as discussed above. Additionally, it should be appreciated that according to one aspect of this embodiment, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that conveys relationship between the fields. However, any suitable mechanism may be used to establish a relationship between information in fields of a data structure, including through the use of pointers, tags or other mechanisms that establish relationship between data elements.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Also, circuits and modules depicted and described may be reordered in any order, and signals may be provided to enable reordering accordingly.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

The invention claimed is:

1. An automatic test system comprising:
a driver comprising an output and a first timing input and a second timing input, wherein the driver is configurable so as to drive the output in a first state in response to an edge at the first timing input and to drive the output in a second state in response to an edge at the second timing input;
a circuit adapted to receive a first plurality of time specifications and a second plurality of time specifications and to output a third plurality of time specifications and a fourth plurality of time specifications, the third plurality of time specifications and fourth plurality of time specifications collectively defining a sequence of edges that is the same as a sequence of edges that is collectively defined by the first plurality of time specifications and second plurality of time specifications, wherein the third plurality of time specifications and fourth plurality of time specifications collectively contain a number of time specifications that is less than the number of timing edges contained collectively in the first plurality of time specifications and second plurality of time specifications;
a first set of edge generators, wherein each of the edge generators in the first set comprises:
an edge generator input coupled to the circuit, and
an edge generator output coupled to the first timing input of the driver;
and is adapted to:
receive at a respective edge generator input a time specification of the third plurality of time specifications, and
generate an edge at the edge generator output at a time determined from the time specification received at the respective edge generator input; and
a second set of edge generators, wherein each of the edge generators in the second set comprises:
an edge generator input coupled to the steering circuit, and
an edge generator output coupled to the second timing input of the driver;
and is adapted to:
receive at a respective edge generator input a time specification of the fourth plurality of time specifications, and
generate an edge at the edge generator output at a time determined from the time specification received at the respective edge generator input.

2. The automatic test system of claim 1, wherein:
the test system further comprises a time set memory, wherein the time set memory:
is configured to store a plurality of time sets, each of the time sets comprising a plurality of time specifications;
comprises a selection input; and
is adapted to output a plurality of time specifications in a timing set selected based on a value at the selection input, and
the automatic test system further comprises:
a pin data memory; and
a formatting circuit coupling the time set memory to the circuit, wherein the formatting circuit may be configured to combine the time specifications in the selected timing set with a value from the pin data memory to generate the first plurality of time specifications and the second plurality of time specifications.

3. The automatic test system of claim 1, wherein:
the first timing input comprises a drive HI input, and
the second timing input comprises a drive LO input.

4. The automatic test system of claim 1, wherein:
first plurality of time specifications and a second plurality of time specifications collectively comprise m time specifications, and
the third plurality of time specifications and fourth plurality of time specifications collectively comprise n time specifications,
wherein $2n < m$.

* * * * *